United States Patent
Nacker et al.

[11] Patent Number: 5,925,402
[45] Date of Patent: Jul. 20, 1999

[54] METHOD OF FORMING A HIDDEN IDENTIFICATION USING POWDER COATING

[75] Inventors: Wayne E. Nacker, Western Springs; Robert M. Didrick, Elmhurst, both of Ill.

[73] Assignee: Morton International, Inc., Chicago, Ill.

[21] Appl. No.: 09/118,192

[22] Filed: Jul. 15, 1998

[51] Int. Cl.$^6$ .................................................. B05D 5/00
[52] U.S. Cl. ............................ 427/7; 427/195; 427/198; 427/201; 427/202
[58] Field of Search ........................... 427/195, 198, 427/96, 7, 258, 201, 203

[56] References Cited

U.S. PATENT DOCUMENTS

| | | | |
|---|---|---|---|
| 4,254,163 | 3/1981 | Piazza | 427/96 |
| 4,254,463 | 3/1981 | Piazza | 427/96 |
| 4,526,807 | 7/1985 | Auerbach | 427/53.1 |
| 4,734,451 | 3/1988 | Smith | 524/493 |
| 4,818,562 | 4/1989 | Arcella et al. | 427/53.1 |
| 4,853,252 | 8/1989 | Frankel et al. | 427/53.1 |
| 5,422,146 | 6/1995 | Adams | 427/475 |
| 5,505,320 | 4/1996 | Burns et al. | 216/13 |
| 5,552,191 | 9/1996 | Horinka et al. | 427/475 |
| 5,620,751 | 4/1997 | Brindoepke et al. | 427/506 |
| 5,662,707 | 9/1997 | Jinkerson | 623/6 |
| 5,708,039 | 1/1998 | Daly et al. | 521/61 |
| 5,767,169 | 6/1998 | Leppard et al. | 522/64 |

FOREIGN PATENT DOCUMENTS

| | | | |
|---|---|---|---|
| 56-019794 | 2/1981 | Japan | B41M 5/26 |

OTHER PUBLICATIONS

Mitsubishisi ML3015HD Laser Specifications. (No date available).

*Primary Examiner*—Shrive Beck
*Assistant Examiner*—Jennifer Calcagni
*Attorney, Agent, or Firm*—Wayne C. Nacker; Gerald K. White

[57] ABSTRACT

As a means of providing a patterned coating on a substrate, either decorative or functional, coating powder is applied to a substrate. Then the coating powder is fused or fused and cured in selected portions by computer-guided laser. One application of the invention is to fuse coating powder into a resist pattern for the production of printed circuitry.

5 Claims, 1 Drawing Sheet

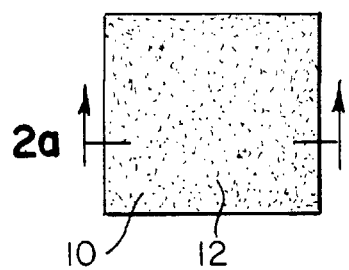
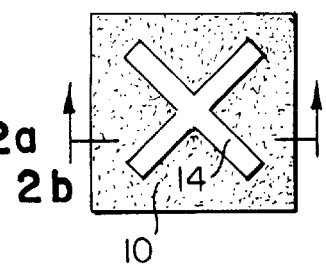
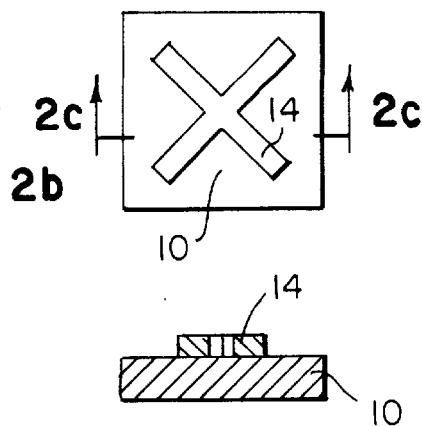
FIG.1a  FIG.1b  FIG.1c
FIG.2a  FIG.2b  FIG.2c
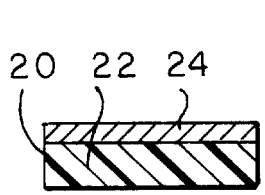
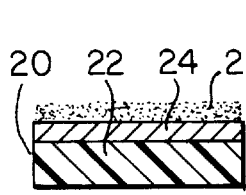
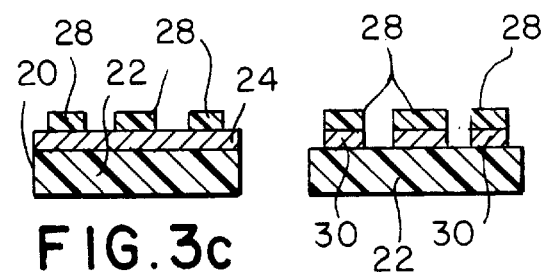
FIG.3a  FIG.3b  FIG.3c
FIG.3d
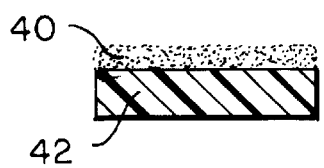
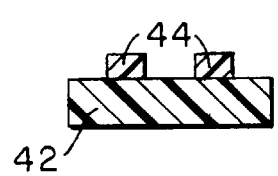
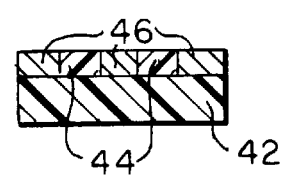
FIG.4a  FIG.4b  FIG.4c
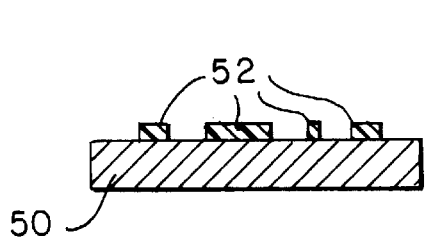
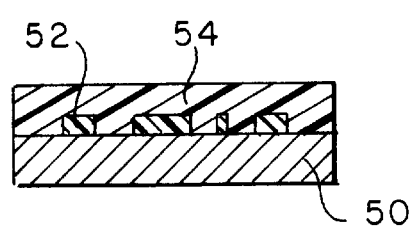
FIG.5a  FIG.5b

METHOD OF FORMING A HIDDEN IDENTIFICATION USING POWDER COATING

The present invention is directed to a method of producing patterns using coating powders.

BACKGROUND OF THE INVENTION

Powder coating as a method of coating a substrate has many known advantages over liquid coatings, including solvent-free application and recovery of over-spray. For the most part, coatings are used for bulk applications, such as coating a lawn-mower chassis or an oil filter.

The present invention is directed to using coating powders to produce patterned images.

SUMMARY OF THE INVENTION

In accordance with the invention, patterned images are produced by depositing a layer of coating powder on a substrate, directing a laser beam at selected portions of the layer so as to fuse the selected portions of the coating powder layer in the case of thermoplastic coating powders and fuse and cure the selected portions of the coating powder in the case of thermosetting coating powders, and subsequently removing non-fused coating powder from remaining portions of the layer. If the coating powder is a UV-curable coating powder, a UV-laser will be used to fuse and cure the coating powder in the desired pattern.

BRIEF DESCRIPTION OF THE DRAWINGS

FIGS. 1a, 1b, and 1c are plan views of a substrate coated with powder and processed to form an "X" pattern.

FIGS. 2a, 2b, and 2c are cross sectional views of FIGS. 1a, 1b, and 1c, respectively.

FIGS. 3a, 3b, 3c, and 3d are cross-sectional views which represent the use of coating powders in accordance with the present invention used to form printed circuitry.

FIGS. 4a, 4b, and 4c are cross-sectional views which represent an alternative way of using coating powders to form printed circuitry.

FIGS. 5a and 5b are cross-sectional views representing the use of the method of the present invention to form a hidden identification on a product.

DETAILED DESCRIPTION OF CERTAIN PREFERRED EMBODIMENTS

The most common method of applying a coating powder to a substrate is electrostatically. This method coats a substrate with a coating powder layer of generally uniform thickness. Subsequently, the coating powder is heated to fuse or fuse and cure the coating powder. Thus, an overall, generally uniform, coating is achieved.

The present invention is directed to a method for using coating powders to produce images or patterns using coating powders. Generally, any known type of coating powder can be used in the invention, including thermosetting, thermoplastic, and UV-curable coating powders. The choice of coating powder used will depend upon factors such as appearance, compatibility with substrate, and durability desired. Some typical types of thermosetting powders include polyester urethane, polyester TGIC (triglycidyl isocyanurate), acrylic urethanes, acrylic hybrids (acid functional resins), glycidyl methacrylate acrylate (GMA) epoxy functional resins, epoxy-based coating powders, and epoxy/ polyester hybrid coating powders. Thermoplastic coating powder types include polyamides, polyolefins, polyvinylchloride-based coating powders, polyester coating powders and poly(vinylidene fluoride) coating powders. UV-curable coating powders are described, for example, in U.S. Pat. No. 5,767,169, the teachings of which are incorporated herein by reference.

The invention is applicable to a wide variety of substrates. Conventionally, coating powders have been most applicable to coating metals, due to the relative high temperatures of fusing or fusing and curing. Recently, however, coating powders have been developed for coating more heat-sensitive materials, such as wood, wood-related products, and heat-sensitive plastics. One of the advantages of the method of the present invention is that in using a laser beam for fusion or fusion and curing of the coating powder, coating powders may be used which, in ordinary bulk applications, would not be suitable for a particular substrate due to the elevated fusion or fusion/cure temperature relative to the heat sensitivity of the particular substrate.

Coating powders come in a wide variety of particle sizes, ranging from about 0.02 to about 100 microns in average particle size. At the upper end of the scale, the large particle sizes may advantageously be used to produce raised images. For example, the imaging techniques of the present invention could be used to produce Braille writing on a substrate. At the lower end of the scale, very fine coating powders, such as those described in U.S. Pat. Nos. 4,734,451, 5,552,191, and 5,708,039, the teachings of each of which are incorporated herein by reference, can be used in conjunction with very narrow laser beams to produce very fine images. U.S. Pat. No. 4,734,451 to Battelle describes polystyrene coating powders ranging from 0.02 to 5 microns in size. U.S. Pat. No. 5,708,039 describes coating powders having a mean particle size of 4.4 microns and a median size of 6–7 microns. Such fine imaging is desired, for example, in electronic circuitry applications where increasing miniaturization is ever a goal.

Broadly, the invention encompasses any method of directing a heat-producing laser beam at a layer of coating powder on a substrate. This could even include a hand-held laser for producing a producing a person's signature. However, it is generally contemplated that computer guided laser apparatus, such as metal milling apparatus as 5-axis Super Rapido Prima laser sold by Abuma Mfg. Ltd., Acer Ultima EVS-3UKH vertical milling machine, Mitsubishsi ML3015HD, and Fabi WIN sold by McBeth metal products, will be used such that the thermal energy applied at the selected printing locations can be precisely predetermined and such that the laser-produced pattern can be precisely determined. If metal milling lasers are used, they are used at very low powers and apply far less energy per unit area than are used for metal milling applications.

Energy requirements per unit area will vary over a wide range, depending upon the coating powder used and the thickness to which the coating powder is applied to a substrate. The exposure time or a particular coating powder at a particular thickness using a particiular laser apparatus is best determined empirically. Coating powders, depending on their composition, are typically fused or fused and cured at temperatures ranging from about 200° F. to 400° F. (93–204° C.).

If the coating powder is UV-curable, a UV-laser will be used which will provide both the thermal energy to fuse the powder and the UV light to cure the fused coating powder. The thickness of UV-curable coating powder layers are typically about 1 mil or less so that the UV light can penetrate to effect the desired cure. UV-curable coating powders are preferred for use in accordance with the invention where highest resolution of image is required.

Illustrated in FIGS. 1a and 2a are a substrate 10, e.g., a metal substrate, covered with a layer of coating powder 12. Computer-guided laser apparatus is employed to fuse or fuse/cure a portion of the coating powder layer, in this case the "X" portion 14 in FIGS. 1b and 2b. Subsequently, the un-fused powder is removed, e.g., with compressed air, to leave the X pattern 14 on the substrate 10. Almost any desired pattern can be produced, including purely decorative patterns or functional patterns, such as raised dots for braille reading or product-identifying bar codes.

In a particular application in accordance with the invention, coating powder may be used as a resist to form printed circuitry. Illustrated in FIG. 3a is a circuit board blank 20 in which a non-conductive epoxy/fiberglass board 22 is covered with a conductive copper cladding 24. A chemical-resistant coating powder 26 is applied to the copper cladding. Selected portions of the layer of coating powder 26 are fused or fused/cured as described above, and un-fused coating powder removed to produce "resist" lines 28. Subsequently, a copper etchant, such as ferric chloride, is used to etch away those portions of the copper cladding 24 which are not covered by the resist lines 28, leaving copper circuitry traces 30. The resist lines 28 may be left covering and protecting the copper circuitry traces 30, or all or portions of the resist lines 28 may be removed. For example, a xenon flash lamp might be used to burn off the resist lines 28.

FIGS. 4a through 4c illustrate an alternative way of using coating powder to form printed circuitry. In this case, a layer of powder 40 is deposited on a non-conducting substrate 42, e.g., an epoxy/fiberglass prepreg board which has been coated with an electroless coating catalyst. The powder is then fused or fused/cured and un-fused powder removed to build up negative coating traces 44 (FIG. 4b). Then circuitry traces 46, typically of copper, are deposited by electroless plating between the coating traces 46 as seen in FIG. 4C. In this case, there may be no need to remove the negative coating traces 44, and the same may actually protect the circuitry traces along their lateral edges.

FIG. 5a represents a substrate 50 to which an identifying pattern 52 has been applied by the method of the present invention. This may take, for example, the form of a bar code. Shown in FIG. 5b shows this same substrate 50 and identifying pattern 52 with a pattern-engulfing coating 54, such as might be deposited by conventional bulk powder coating techniques. This covered identifying pattern 52 is then "silent", but may be later identified merely by sanding away the overcoating 54 in the region of the pattern. Such "silent" marking of a product might serve as a way of distinguishing a genuine article from a counterfeit article. Such need could arise at a customs inspection or to identify stolen automobile parts. Also, in liability suits where a counterfeit part may have been responsible for a product failure, the manufacturer who had marked his parts with such silent markings might escape liability by proving the part counterfeit.

While the invention has been illustrated with respect to flat substrates, the invention is not limited to forming images on flat substrates. Powder coating is applicable to contoured substrates and computer guided lasers are capable of directing patterned beams to contoured surfaces.

In the case of thermoset powders, it is contemplated that the laser beam-generated heat will effect the cure. Using UV-curable coating powders, the laser beam will provide both the heat to fuse the coating powder and the UV light to cure the coating powder.

What is claimed is:

1. A method of providing a hidden identification on a substrate, the method comprising:
   A) forming a first patterned coating on a substrate by
      applying a layer of a coating powder selected from the group consisting of thermoplastic, thermoset and UV-curable coating powders to a substrate,
      subjecting selected patterned portions of said coating powder layer to a laser beam so as to generate sufficient heat to fuse said selected patterned portions in the case of a thermoplastic coating powder, sufficient heat to fuse and cure said selected patterned portions in the case of a thermoset coating powder, and sufficient heat and UV light to fuse and cure a UV-curable coating powder; and
      removing unfused powder; plus
   B) forming a second coating from a coating powder over said first patterned coating so as to cover said first patterned coating, said second coating being formed by applying a coating powder layer of generally uniform thickness over said substrate having said first patterned coating and then fusing or fusing and curing said coating powder layer;
   said first patterned coating being subsequently identified by removing said second coating thereover.

2. The method of claim 1 wherein said laser beam is provided by a computer-guided laser.

3. The method of claim 1 wherein said coating powder used to form said first patterned layer is thermoplastic.

4. The method of claim 1 wherein said coating powder used to form said first patterned layer is thermoset.

5. The method of claim 1 wherein said coating powder used to form said first patterned layer is UV-curable.

* * * * *